United States Patent [19]

Peters

[11] Patent Number: 4,882,136
[45] Date of Patent: Nov. 21, 1989

[54] PROCESS FOR THE PRODUCTION OF TRANSPARENT ALUMINUM NITRIDE FILMS

[75] Inventor: Dieter Peters, Hürth, Fed. Rep. of Germany

[73] Assignee: Hoechst Aktiengesellschaft, Frankfurt am Main, Fed. Rep. of Germany

[21] Appl. No.: 240,139

[22] Filed: Sep. 2, 1988

[30] Foreign Application Priority Data

Sep. 18, 1987 [DE] Fed. Rep. of Germany ....... 3731455

[51] Int. Cl.$^4$ ............................................ C01B 21/072
[52] U.S. Cl. ............................ 423/412; 156/DIG. 61; 156/DIG. 99
[58] Field of Search ............... 423/412; 156/DIG. 61, 156/DIG. 99

[56] References Cited

U.S. PATENT DOCUMENTS

| 4,095,331 | 6/1978 | Rutz | 423/412 |
| 4,152,182 | 5/1979 | Rutz | 423/412 |
| 4,172,754 | 10/1979 | Dryburgh | 423/412 |

OTHER PUBLICATIONS

G. A. Cox et al, "On The Preparation, Optical Properties and Electrical Behaviour of Aluminum Nitride", *J. Phys. Chem. Solids,* Pergamon Press 1967, vol. 28, pp. 543–548.

V. I. Myakinenkov et al, "Preparation of AIN", *Inorganic Materials,* vol. 10, No. 10, pp. 1635–1636, Oct. 1974 (Publ. Mar. (1975), Plenum Publishing Corporation.

George W. Watt et al, "The Ammoniation, Ammonolysis and Hydrolysis of Aluminum (III) Iodide", *J. Am. Chem. Soc.* 78 (1956), pp. 5494–5496.

Primary Examiner—John Doll
Assistant Examiner—Wayne A. Langel

[57] ABSTRACT

A process is given for the production of transparent aluminum nitride films in which the aluminum nitride films comprise a nomocrystal and are obtained by evaporation of ammine salts of aluminum iodide in an evaporation zone and subsequent ammonolysis in a decomposition zone at 380° to 550° C.

10 Claims, 2 Drawing Sheets

PROCESS FOR THE PRODUCTION OF TRANSPARENT ALUMINUM NITRIDE FILMS

The invention relates to a process for the production of transparent aluminum nitride films.

Aluminum nitride films are employed, in particular, as high-temperature materials since they have good properties, such as high thermal conductivity, corrosion resistance and strength.

Aluminum nitride films can be employed as window materials for sensors at high temperatures.

Aluminum nitride films have hitherto been produced, for example by an expensive sintering process from aluminum nitride powder.

The object was therefore to provide a process for the production of transparent aluminum nitride films which is simple and inexpensive to carry out and where the aluminum nitride films have a smooth surface having a roughness of less than 0.3 $\mu$m.

This object is achieved according to the invention in that the aluminum nitride films comprise a monocrystal and are obtained by evaporation of ammine salts of aluminum iodide in an evaporation zone and subsequent ammonolysis in a decomposition zone at 380° to 550° C.

According to the present invention, the starting materials employed for the ammonolysis are preferably hexaammine-aluminum iodide, pentaamminealuminum iodide or hexaamminealuminum iodide monoammoniate.

According to the invention, the ammine salt of aluminum iodide can be transported out of the evaporation zone into the decomposition zone by means of an oxygen-free and water-free carrier gas.

According to the invention, ammonia, a noble gas, nitrogen, hydrogen or a mixture thereof can be employed as the carrier gas.

Good results are achieved when the evaporation and decomposition zones are operated at a pressure of 0.01 to 3 bar, the evaporation zone being kept at a temperature between 200 and 380° C., in particular between 350° and 370° C.

A process variant is when the ammine salt of aluminum iodide is formed in the evaporation zone by passing ammonia over aluminum iodide at a temperature of 200° to 380° C., in particular 350° to 370° C., and transported into the decomposition zone using excess ammonia is the carrier gas.

It has been shown that the aluminum nitride film is readily removable if it is deposited as a monocrystal on a heated quartz surface as the decomposition zone.

A process variant is when pentaamminealuminum iodide is evaporated in the evaporation zone at 350° to 380° C. in the absence of foreign gases and decomposed in the decomposition zone at 380° to 550° C.

According to the invention, monocrystalline, transparent aluminum nitride films having a thickness of 20 $\mu$m and a surface roughness of less than 0.3 $\mu$m, particularly less than 0.01 $\mu$m, are produced in which the crystallographic C axis is perpendicular to the film plane.

The orientation of the C axis was determined by means of X-ray photographs and by means of the behavior when observed in polarized light. Scanning electron photomicrographs have shown that the aluminum nitride films are pore-free and have a very smooth surface, the roughness of which is less than 0.3 $\mu$m, particularly less than 0.1 $\mu$m, in particular less than 0.01 $\mu$m.

Figure 1:
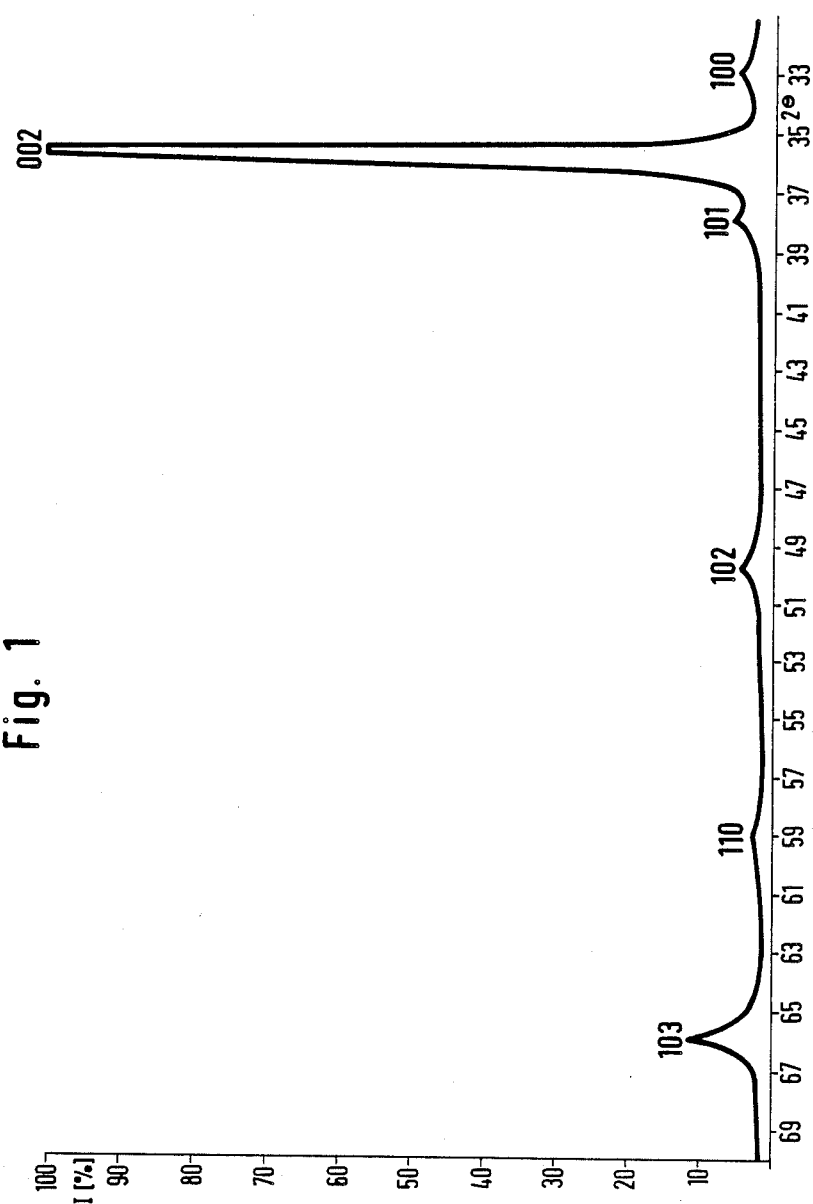
FIG. 1 shows the X-ray photograph of an aluminum nitride film which has been produced in accordance with Example 1. Only the 002 and 103 reflections can be seen in the X-ray photograph.
Figure 2:
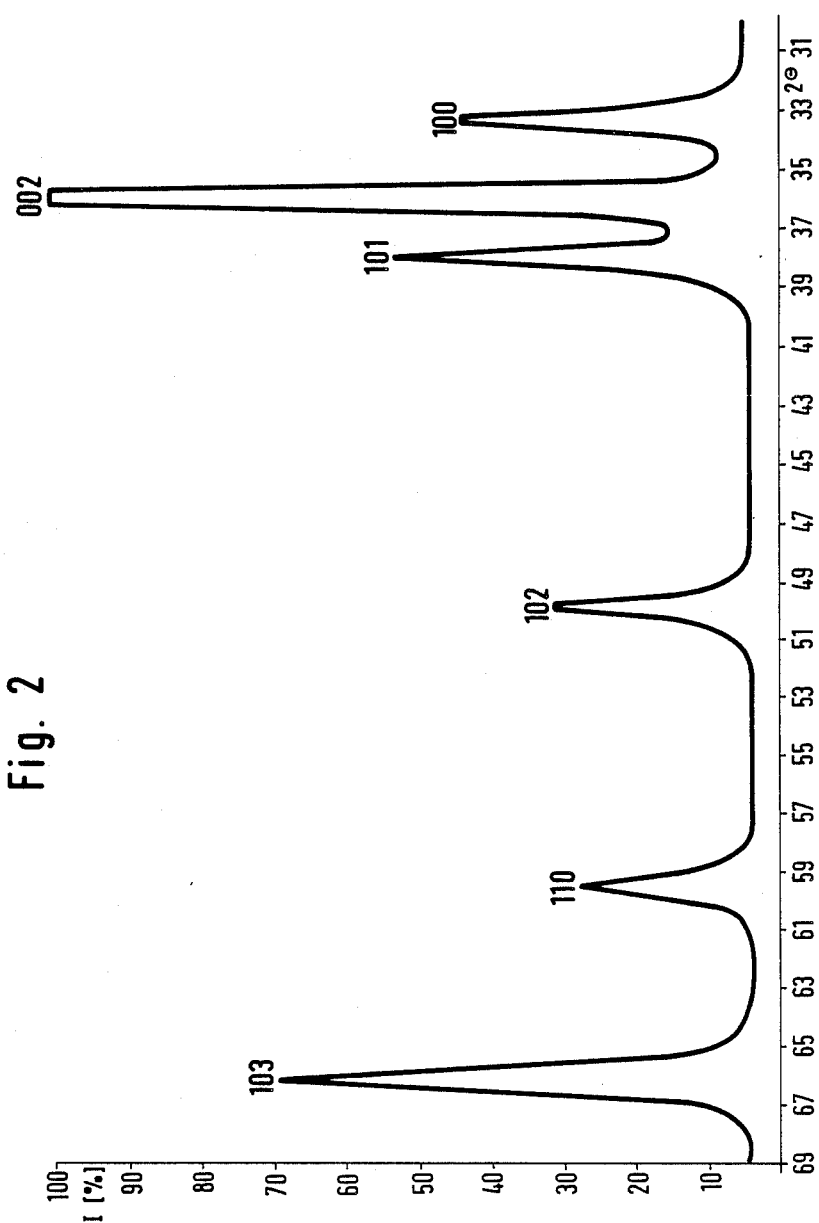
FIG. 2 shows the X-ray diagram of a ground aluminum nitride film obtained in accordance with Example 1. The texture of the X-ray diagram shows that the C axis of the monocrystal is perpendicular to the film axis.

The examples below serve to illustrate the invention without representing a limitation.

EXAMPLE 1

Production of an aluminum nitride film (Starting material: hexaamminealuminum iodide monoammoniate)

27 parts of aluminum turnings and 435 parts of ammonium iodide are placed in an enamelled, heatable stirred autoclave under an inert gas ($N_2$ or Ar). After evacuation of the autoclave, 561 parts of ammonia were condensed in. After sealing, the autoclave was heated to 75° C. and kept at this temperature for 99 hours. A pressure of 35 bar was produced. The pressure in the autoclave was subsequently reduced to atmospheric pressure at room temperature. The product had the following analysis:

$Al_{0.179} I_{0.573} N_{1.289}$ and thus corresponded to the formula
$[Al(NH_3)_6]I_3(NH_3) + 0.201\ NH_4I$

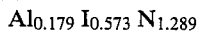

Relative to the aluminum, the yield was 94 %.

The $[Al(NH_3)_6]I_3(NH_3)$ thus prepared was evaporated at 375° C. in a quartz tube and transported into the decomposition zone by means of $NH_3$ gas at 1.1 bar. The temperature in the decomposition zone was 430° C. Transparent films formed on the quartz wall and could easily be removed from the quartz tube after cooling to room temperature.

EXAMPLE 2

Production of an aluminum nitride film (Starting material: pentaamminealuminum iodide)

27 parts of aluminum turnings, 381 parts of iodine and 4 parts of ammonium chloride were placed in the autoclave under an inert gas ($N_2$ or Ar), and 540 parts of ammonia were condensed in after evacuation. The autoclave was heated to 320° C. and kept at this temperature and a pressure of 180 bar for 7 hours. The pressure in the autoclave was subsequently reduced to atmospheric pressure at a temperature of 320° C. The product had the following analysis:

$Al_{0.182} I_{0.612} N_{0.985}$
and thus corresponded to the formula $[Al(NH_3)_{5.05}]I_3 + 0.363\ NH_4I$

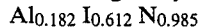
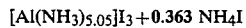

Relative to aluminum, the yield was 89 %.

The pentaamminealumium iodide thus prepared was evaporated in a quartz tube at 370° C. without foreign gases. At 500° C., transparent aluminum nitride films formed in the decomposition zone and could easily be removed from the quartz wall at room temperature.

We claim:

1. A process for the production of a transparent aluminum nitride film, wherein the aluminum nitride comprises a monocrystal and is obtained by evaporation of ammine salts of aluminum iodide in an evaporation zone and subsequent ammonolysis in a decomposition zone at 380 to 550° C.

2. The process as claimed in claim 1, wherein the starting material employed for the ammonolysis is hexaamminealuminum iodide, pentaamminealuminum iodide or hexaamminealuminum iodide monoammoniate.

3. The process as claimed in claim 1, wherein the ammine salt of aluminum iodide is transported out of the evaporation zone into the decomposition zone by means of an oxygen-free and water-free carrier gas.

4. The process as claimed in claim 3, wherein the carrier gas employed is ammonia, a noble gas, nitrogen, hydrogen or a mixture thereof.

5. The process as claimed in claim 1, wherein the evaporation and decomposition zones are operated at a pressure of 0.01 to 3 bar, the evaporation zone being kept at a temperature between 250 and 380° C.

6. The process as claimed in claim 1, wherein the ammine salt of aluminum iodide is formed in the evaporation zone by passing ammonia over aluminum iodide at a temperature of 200 to 380° C. and transported into the decomposition zone using excess ammonia as the carrier gas.

7. The process as claimed in claim 1, wherein the aluminum nitride film is deposited as a monocrystal on a heated quartz surface as the decomposition zone.

8. A monocrystalline, transparent aluminum nitride film window having a thickness of up to 20 $\mu$m and a surface roughness of less than 0.3 $\mu$m and in which the crystallographic C axis is perpendicular to the film plane.

9. A monocrystalline, transparent aluminum nitride film having a thickness of up to 20 $\mu$m and a surface roughness of less than 0.3 $\mu$m and in which the crystallographic C axis is perpendicular to the film plane, said film having been made by the process of claim 1.

10. A monocrystalline, transparent aluminum nitride film having a thickness of up to 20 $\mu$m and a surface roughness of less than 0.3 $\mu$m and in which the crystallographic C axis is perpendicular to the film plane, said film having been deposited as a monocrystal on a surface and then removed therefrom.

* * * * *